US012787152B2

(12) United States Patent
Ljungbro et al.

(10) Patent No.: US 12,787,152 B2
(45) Date of Patent: Nov. 3, 2026

(54) METHOD OF PRODUCING A PCB, AS WELL AS A PCB, AND A CIRCUIT BOARD

(71) Applicant: Telefonaktiebolaget LM Ericsson (publ), Stockholm (SE)

(72) Inventors: Agneta Ljungbro, Bjärred (SE); Emil Nylander, Lund (SE); Per Ingelhag, Alingsås (SE); Peter Melin, Lindome (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 276 days.

(21) Appl. No.: 18/702,522

(22) PCT Filed: Oct. 28, 2021

(86) PCT No.: PCT/SE2021/051081
§ 371 (c)(1),
(2) Date: Apr. 18, 2024

(87) PCT Pub. No.: WO2023/075653
PCT Pub. Date: May 4, 2023

(65) Prior Publication Data
US 2024/0422894 A1 Dec. 19, 2024

(51) Int. Cl.
*H05K 1/02* (2006.01)

(52) U.S. Cl.
CPC ......... *H05K 1/0206* (2013.01); *H05K 1/0272* (2013.01); *H05K 2201/064* (2013.01);
(Continued)

(58) Field of Classification Search
CPC .. H05K 1/0203; H05K 1/0206; H05K 1/0272; H05K 1/02; H05K 2201/064;
(Continued)

(56) References Cited

U.S. PATENT DOCUMENTS 5,790,376 A * 8/1998 Moore ................ F28D 15/0275
174/15.1
6,321,452 B1 11/2001 Lin
(Continued)

FOREIGN PATENT DOCUMENTS

CA 2640519 A1 8/2007
EP 2053906 A2 4/2009
(Continued)

OTHER PUBLICATIONS

Capillary Flow of Liquids in Open Microchannels_Kolliopoulos et al._pp. 1-6_2021.*
(Continued)

*Primary Examiner* — Timothy J Thompson
*Assistant Examiner* — Guillermo J Egoavil
(74) *Attorney, Agent, or Firm* — Murphy, Bilak & Homiller, PLLC

(57) ABSTRACT

The present invention relates to a method (100) of producing a printed circuit board (300), wherein the printed circuit board (300) comprises a first substrate (301), a second substrate (302), and a heat pipe tube (303) with an open end (304). The method comprises the step of forming (S100) a recess (305) in the first substrate (301), placing (S120) the heat pipe tube (303) in the recess (305) of the first substrate (301) such that the open end (304) is exposed, and laminating (S130) the first substrate (301) and the second substrate (302) with the heat pipe tube (304) embedded in the recess (305) between the first substrate (301) and the second substrate (302). The present invention also relates to a printed circuit board, a circuit board as well as a method for producing a circuit board.

17 Claims, 3 Drawing Sheets

(52) U.S. Cl.
CPC .............. *H05K 2201/09063* (2013.01); *H05K 2201/09072* (2013.01)

(58) Field of Classification Search
CPC .......... H05K 2201/09063; H05K 2201/09072; H05K 2201/10098; H05K 2201/10545; H05K 3/00; H10W 40/228; H10W 40/73
USPC .......................................................... 174/252
See application file for complete search history.

(56) References Cited

U.S. PATENT DOCUMENTS

| | | | |
|---|---|---|---|
| 10,883,769 | B2 | 1/2021 | Silvano De Sousa et al. |
| 2009/0065180 | A1 | 3/2009 | Wits et al. |
| 2011/0005727 | A1 | 1/2011 | Yu et al. |
| 2016/0091258 | A1 | 3/2016 | Ahamed et al. |
| 2016/0262284 | A1 | 9/2016 | Il et al. |
| 2017/0325327 | A1 | 11/2017 | Smith et al. |

FOREIGN PATENT DOCUMENTS

| | | | |
|---|---|---|---|
| JP | 4350606 | B2 | 7/2009 |
| WO | 2020069727 | A1 | 4/2020 |

OTHER PUBLICATIONS

"AT&S Enables "Cool" Designs for Miniaturized High-Power Applications", AT&S, Aug. 30, 2017, 4 pages.

* cited by examiner

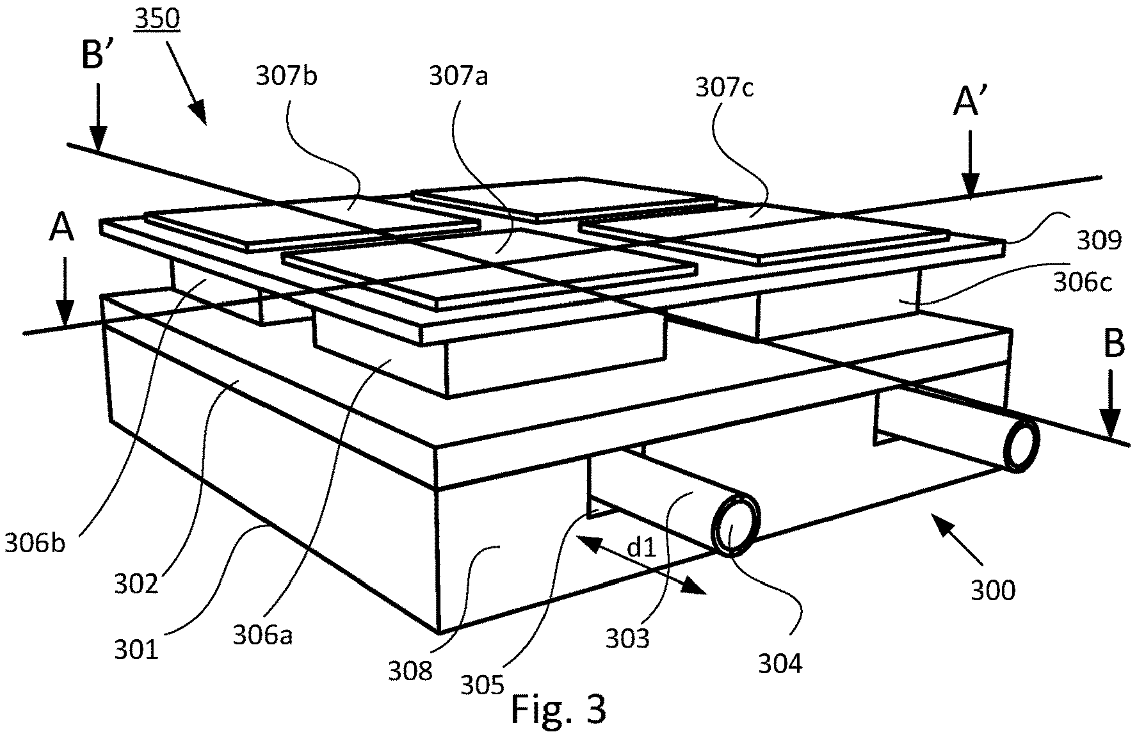
Fig. 3
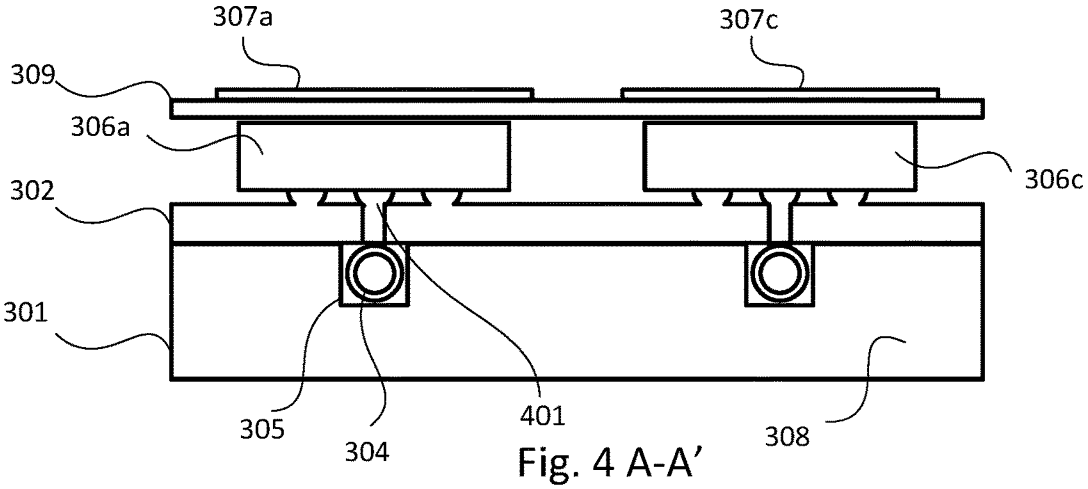
Fig. 4 A-A′
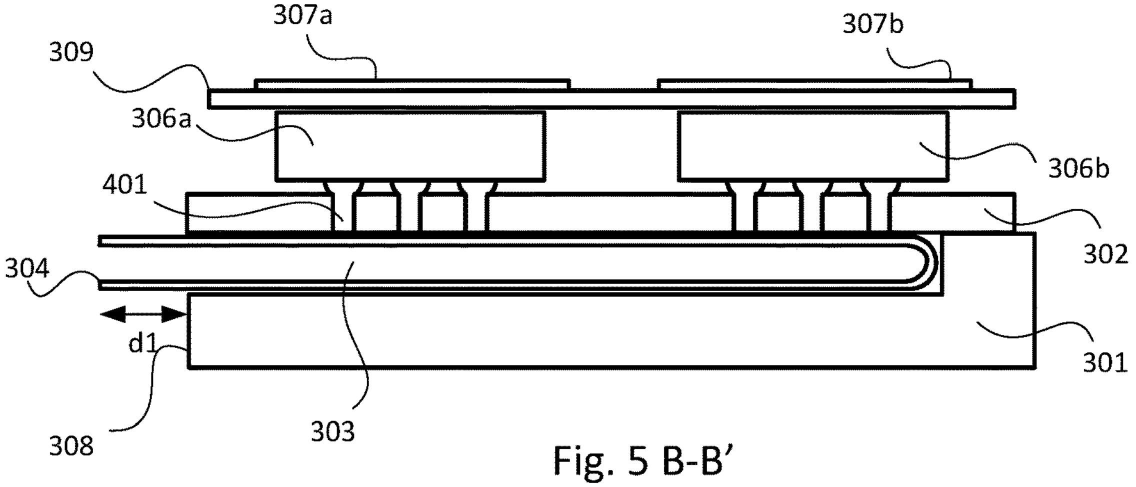
Fig. 5 B-B′

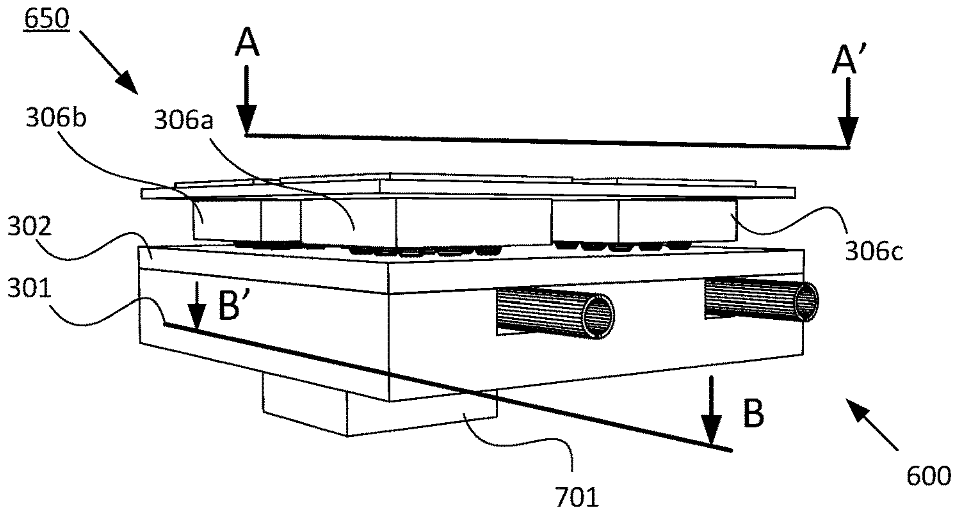
Fig. 6
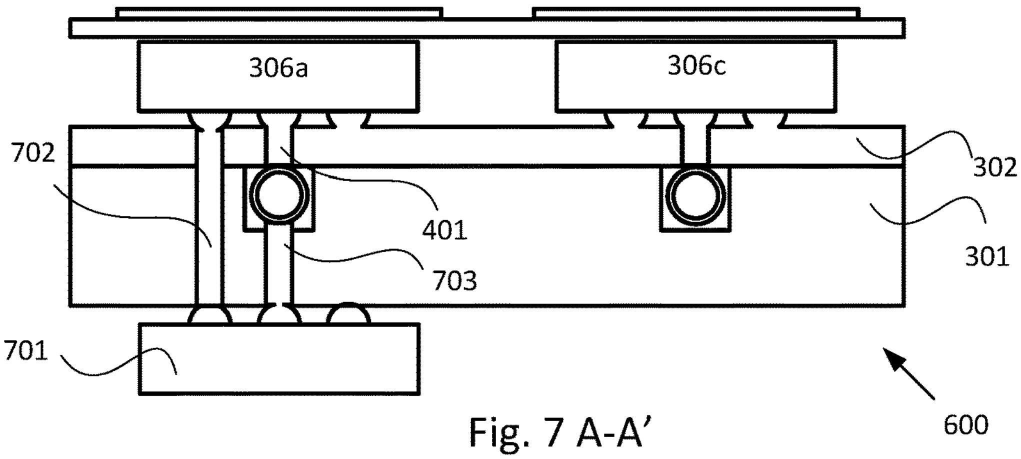
Fig. 7 A-A′
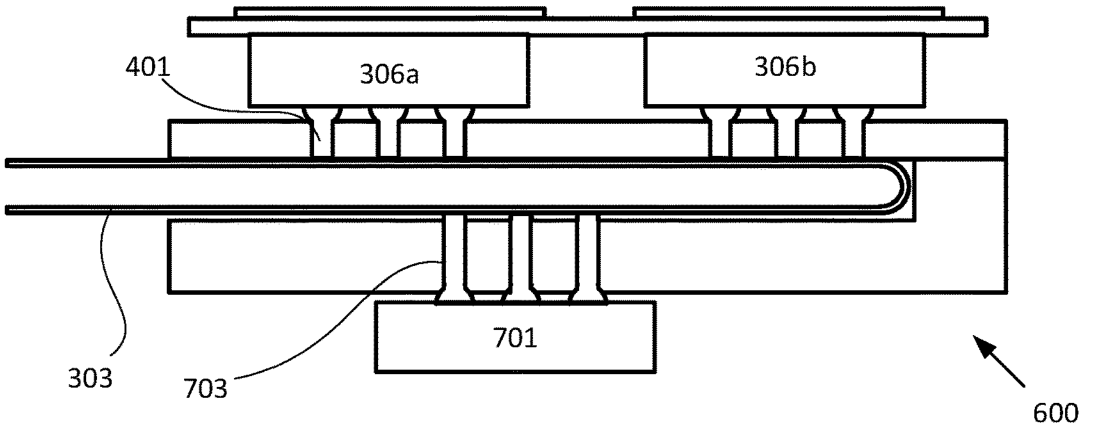
Fig. 8 B-B′

METHOD OF PRODUCING A PCB, AS WELL AS A PCB, AND A CIRCUIT BOARD

TECHNICAL FIELD

The present disclosure relates to a method of producing a printed circuit board. More particular, the disclosure relates to a printed circuit board with embedded heat pipe tubes. The present disclosure also relates to a printed circuit board and a circuit board.

BACKGROUND

Printed circuit boards (PCB) are very important components in dense electronic circuits of today. A PCB is a board provided for holding and connecting the electronic components and connectors of the circuit. A modern PCB comprises several layers laminated together to form a solid board with different layers, such as layers for power supply as well as ground planes and signal traces. In order to connect different layers to each other vertical interconnect access (vias) are commonly employed. A via may be provided for electrical interconnect but may also be provided to guide heat from a circuit to a heat sink, a so called thermal via.

In some PCB there are embedded heat pipes which are connected to circuits by means of thermal vias. The heat pipe comprises an envelope, a wick, and a working fluid and provides a cooling action by means of vaporization of the working fluid in the wick structure. Heat transport will occur along the heat pipe from a hot part towards a cool part.

Embedded heat pipes are promising technologies especially for modern PCBs for telecommunication circuits, since these PCBs often comprises RF circuits with antenna substrates and signal processing circuits, which utilizes power hungry ASICs/FPGAs that needs extreme heat dissipation for safe operation. The problem is further increased if one side of the circuit board is the RF substrate with antenna structures, and the other side of the circuit board is provided with the ASIC circuit. This situation implies that RF circuits may be arranged therebetween and cooling of the RF circuits becomes critical due to the placement between the antenna substrate and the ASICs. Thus, there is an increased interest in a solution which provides efficient heat transfer from within a PCB.

Conventional methods to form a PCB often involve high temperature and pressures above 2-3 MPa, during lamination of the PCB. If a conventional heat pipe is embedded in a PCB during lamination the heat pipe may be deformed either by the internal pressure due to the elevated temperature during lamination or by the ambient pressure. If a heat pipe is physically deformed transport of the working fluid during operation is disrupted and the heat transport in the heat pipe is disturbed. A further problem with an embedded heat pipe is that during the step of reflow, for soldering components to the PCB, the solder alloy is liquified and this often requires a temperature above 240° C. and this may cause a pressure build-up in the heat pipe which is detrimental for the heat pipe.

Thus, there is a desire to develop a method for manufacturing a PCB with embedded heat pipes without the problems related to the increased temperature and increased pressure during lamination and reflow.

SUMMARY

An object of the present disclosure is to provide a method for producing a printed circuit board, which seeks to mitigate, alleviate, or eliminate one or more of the above-identified deficiencies in the art and disadvantages singly or in any combination and to provide an improved production method, as well as an improved printed circuit board and a circuit board.

Further objects and advantages may be found in the detailed description.

This object is obtained by a method of producing a printed circuit board, wherein the printed circuit board comprises a first substrate, a second substrate, and a heat pipe tube with an open end. The method comprises the steps of forming a recess in the first substrate, placing the heat pipe tube in the recess of the first substrate such that the open end is exposed. The method further comprises laminating the first substrate and the second substrate with the heat pipe tube embedded in the recess between the first substrate and the second substrate.

This object is also obtained by a printed circuit board comprising a first substrate with a recess, a second substrate, and a heat pipe tube with an open end. The heat pipe tube is laminated embedded in the recess between the first substrate and the second substrate, such that a part of the heat pipe tube with the open end is exposed.

This object is also obtained by a method of producing a circuit board, comprising providing a printed circuit board as disclosed herein. The method further comprises placing at least one electronic component on the printed circuit board, and reflowing the printed circuit board such that at least one electronic component is electrically connected to the printed circuit board.

This object is also obtained by a circuit board comprising a printed circuit board as disclosed herein, and at least one component electrically connected to the printed circuit board. The at least one component is thermally connected to the heat pipe tube, and the heat pipe tube of the printed circuit board is filled with a cooling medium and is sealed.

An advantage of the disclosed circuit board and printed circuit board is that the heat pipe tube is unsealed during lamination and reflow. The heat pipe tube is filled with a cooling medium and is sealed after reflow. This means that no pressure build-up occurs due to elevated temperature in the heat pipe tube during manufacturing.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the example embodiments.

FIG. 3 is a perspective drawing illustrating embodiments of a printed circuit board and a circuit board according to the present disclosure;

FIG. 4 is a cross sectional drawing along line A-A' in FIG. 3;

FIG. 5 is a cross sectional drawing along line B-B' in FIG. 3;

FIG. 6 is a perspective drawing illustrating embodiments of a printed circuit board and a circuit board according to the present disclosure;

FIG. 7 is a cross sectional drawing along line A-A' in FIG. 6; and

FIG. 8 is a cross sectional drawing along line B-B' in FIG. 6.

DETAILED DESCRIPTION

Figure 1:
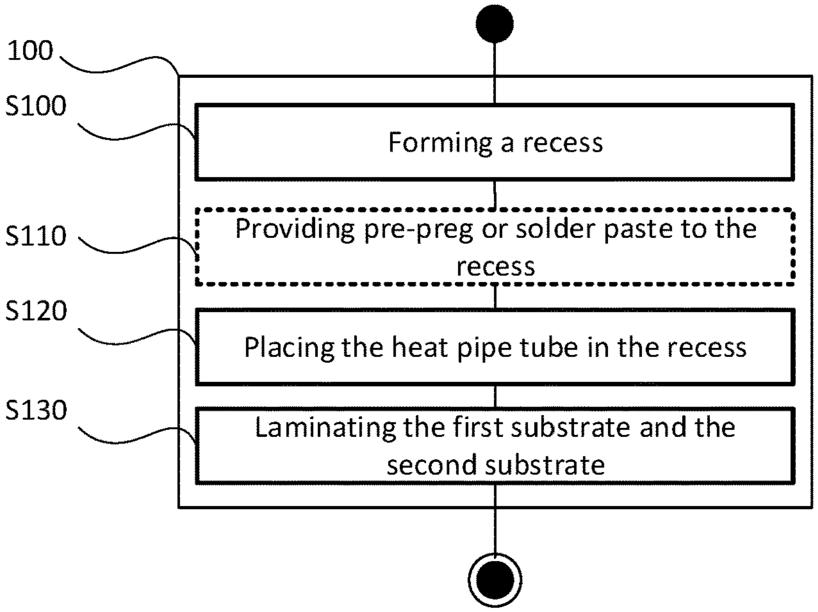
FIG. 1 is a flow chart illustrating embodiments of method steps for producing a printed circuit board according to the present disclosure.

Aspects of the present disclosure will be described more fully hereinafter with reference to the accompanying drawings. The apparatus and method disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

In this disclosure the term 'heat pipe' should be interpreted as a heat pipe tube with a wick structure and a cooling medium. The term 'heat pipe tube' should be interpreted as an enclosure for the wick structure and the cooling medium.

Furthermore, in this disclosure the term printed circuit board (PCB) should be interpreted as a carrier substrate with different layers and structures as well as traces and pads for electronic components, but without electronic components mounted on the PCB. On the other hand the term circuit board should be interpreted as a PCB with mounted electronic components. Often this mounting is achieved by placing electronic components on the PCB with soldering paste applied at points of electrical contact. The PCB is then subjected to heat such that the soldering alloy of the soldering paste is liquified followed by cooling which solidifies the soldering alloy and permanent electrical contact is achieved.

Some of the example embodiments presented herein are directed towards an improved printed circuit board. As part of the development of the example embodiments presented herein, a problem will first be identified and discussed. In conventional manufacturing of a printed circuit board, PCB, there are problems associated with embedding of a heat pipe within the PCB. Several attempts have been made in the past. However, the heat pipe may be deformed and destroyed by the elevated temperature and pressure during lamination of the PCB, or due to the elevated temperature during reflow. In a reflow process the soldering paste is liquified and cooled to its solid state, and the liquefaction often requires temperatures over 240° C. This temperature causes a high internal pressure to build-up in the heat pipe, which may cause damage to the heat pipe. The process of lamination often requires subjecting the PCB to an external pressure above 2 MPa, and this pressure may permanently deform the heat pipe, such that heat transport in the heat pipe is disturbed or even prevented.

The present inventors realized that these problems may be minimized or even eliminated by laminating a heat pipe tube that is open in one end embedded between a first substrate and a second substrate of the PCB. The first and second substrate may be produced using conventional PCB manufacturing processes with elevated temperatures and pressures. It is imperative that the open end is accessible from the outside of the PCB for filling the heat pipe tube with a cooling medium, and optionally a wick structure if it's not already positioned in the heat pipe tube, before sealing the heat pipe tube. This allows furnishing a complete circuit board that comprises the printed circuit board according to embodiments disclosed herein and components mounted thereto by means of reflow. The heat pipe tube is then filled and sealed. Since the heat pipe tube is open in one end during the process steps that involve high pressure and/or high temperature the heat pipe tube is protected from increased internal pressure.

Now with reference made to FIGS. 1 and 3. In which FIG. 1 shows a flowchart illustrating a method, generally designated 100, of producing a printed circuit board 300 (as shown in FIG. 3). The printed circuit board comprises a first substrate 301, a second substrate 302, and a heat pipe tube 303 with an open end 304. The heat pipe tube 303 is a metallic tube with an open end and the other end thereof is sealed in such a way that the sealing does not interfere with the structural strength of the heat pipe tube.

The method comprises the step of:

Forming S100 a recess 305 in the first substrate 301. This recess 305 is formed by means of milling, which is an example of subtractive manufacturing.

Placing S120 the heat pipe tube 303 in the recess 305 of the first substrate 301 such that the open end 304 is exposed. As shown in FIG. 3 the part of the heat pipe tube 303 with the open end 304 extends a distance d1 from a face of the first substrate 301. The distance d1 is at least 2 mm from the face of the first substrate 301. As shown in FIG. 3 the face of the first substrate 301 is a lateral face 308.

Laminating S130 the first substrate 301 and the second substrate 302 with the heat pipe tube 304 embedded in the recess 305 between the first substrate 301 and the second substrate 302.

Optionally the method 100 further comprises a step of providing, generally designated S110, pre-preg or sintering paste to at least a part of the recess 305, whereby the heat pipe tube is secured in the recess, prior to laminating S130 the first substrate 301 and the second substrate 302. This way the heat pipe tube 303 is mechanically secured in the recess 305 which may be advantageous for the mechanical stability of the PCB.

In FIG. 3 a printed circuit board, generally designated 300, is shown. The printed circuit board 300 comprises a first substrate 301 with a recess 305;

a second substrate 302;

a heat pipe tube 303 with an open end 304, wherein the heat pipe tube 303 is laminated and embedded in the recess 305 between the first substrate 301 and the second substrate 302, such that a part of the heat pipe tube 303 with the open end 304 is exposed.

FIG. 5 is a cross sectional view in a plane defined by line B-B' in FIG. 3. This FIG. 5 discloses that a part of the heat pipe tube 303 with the open end 304 extends a distance d1 from a face of the first substrate 301. The distance d1 is at least 2 mm from the face of the first substrate 301, which in this embodiment is a lateral face 308.

Figure 2:
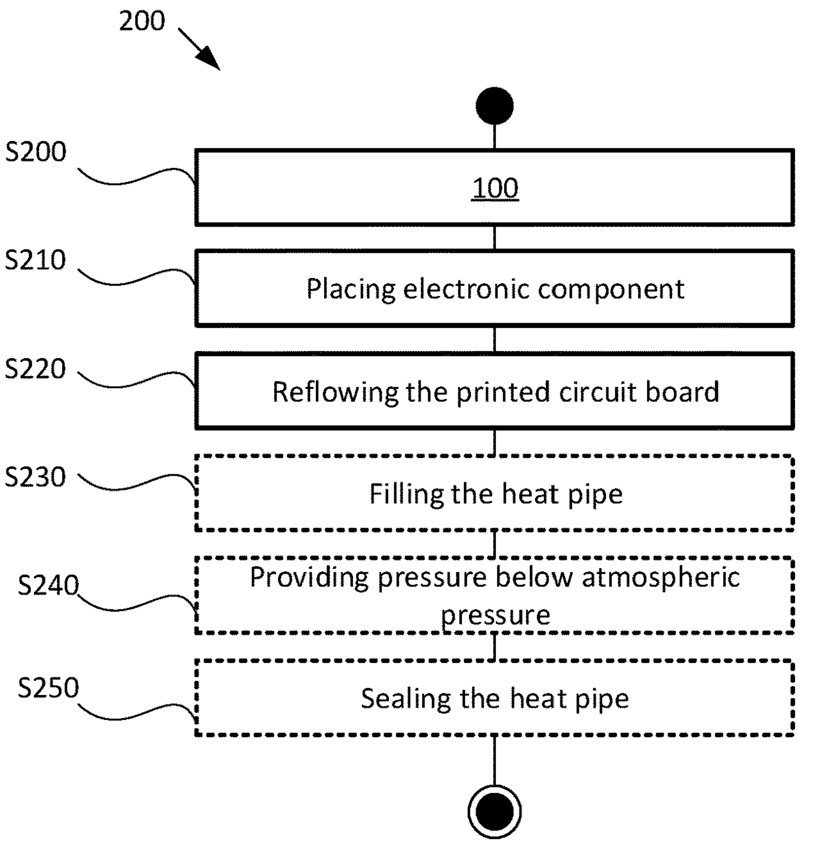
FIG. 2 is a flow chart illustrating embodiments of method steps for producing a circuit board according to the present disclosure.

Now with reference made to FIG. 2 which discloses a method, generally designated 200, of producing a circuit board. The method comprises the steps of:

Providing S200 a printed circuit board according to embodiments disclosed herein above.

Placing S210 at least one electronic component 306*a-d* on the printed circuit board. This step is conventionally performed by means of a pick-and-place robot.

Reflowing S220 the printed circuit board such that the placed at least one electronic component is electrically connected to the printed circuit board.

Optionally, if the heat pipe tube should be operational as a heat pipe. The method 200 further comprises the steps of:

- Filling S230 the heat pipe tube 303 with a cooling media through the open end 304, after reflowing S220 the printed circuit board. The cooling medium may be a liquid cooling medium, such as for example water.
- Sealing S250 the open end of the heat pipe tube, after filling S230 the heat pipe tube. The sealing may be performed by means of welding.

Optionally, a further step of providing S240 the heat pipe tube with a pressure below the atmospheric pressure, prior to sealing S250 the heat pipe tube, may be applied. This way the heat pipe is fully operational.

The above steps of filling S230 and sealing S250 the heat pipe tube 303 is advantageously performed on the open end 304 of the heat pipe tube 303 that is exposed. It is possible that the open end of the heat pipe extends a distance significantly longer than 2 mm and is directly connected to a cooling device. In other embodiments the PCB comprises a coin (metallic plate) connected to the heat pipe by means of thermal vias. The coin is connected to a heat sink.

Now with reference made to FIG. 3 again. In FIG. 3 a first example of a circuit board 350 is also disclosed and comprises:

- a printed circuit board 300 according to embodiments disclosed herein;
- at least one component 306*a-c* electrically connected to the printed circuit board and wherein the at least one component is thermally connected to the heat pipe tube 303; and
- wherein the heat pipe tube 303 of the printed circuit board is filled with a cooling medium and sealed.

In FIG. 4 a cross section of the circuit board 350 along the plane A-A' of FIG. 3 is shown. This FIG. 4 shows that the component 306*a* is thermally connected to the heat pipe tube by means of a thermal via 401. This is further illustrated in FIG. 5 which discloses that three thermal vias are used for each component.

Now with reference made to FIG. 6-8 in which a second example of a circuit board 650 is disclosed. The second example differs from the first example disclosed with reference made to FIG. 3 in that a further component 701 is arranged on the printed circuit board on a face opposing the face of the printed circuit board on which the at least one component 306*a-c* is arranged, wherein the further component 701 is thermally connected to the heat pipe tube 303 by means of further at least one thermal via 703. The further component 701 is electrically connected to one of the at least one components 306*a-c* by means of a signal via 702 through the printed circuit board. This way a tight integration may be achieved in which thermal vias and signal vias are distributed on the PCB.

The at least one component may be an amplifier circuit for RF mounted on a first side of a further substrate 309 with antennas 307*a-c* arranged on a second side of the further substrate 309 opposing the first side. Efficient cooling may be achieved for the amplifier circuit by means of the embedded heat pipes. The further component 701 may be a signal processing circuit electrically connected to the amplifier by means of signal vias routed through the PCB. This way short signal paths are achieved which is very desirable for RF and microwave technologies. The embedded heat pipe tubes provide efficient cooling for all components on the PCB.

The disclosure relates to a method of producing a printed circuit board, wherein the printed circuit board comprises:

- a first substrate;
- a second substrate;
- a heat pipe tube with an open end; and wherein the method comprises the step of:
  - forming a recess in the first substrate;
  - placing the heat pipe tube in the recess of the first substrate such that the open end is exposed; and
  - laminating the first substrate and the second substrate with the heat pipe tube embedded in the recess between the first substrate and the second substrate.

According to some embodiments, a part of the heat pipe tube with the open end extends a distance from a face of the first substrate.

According to some embodiments, the distance is at least 2 mm from the face of the first substrate.

According to some embodiments, the face of the first substrate is a lateral face.

According to some embodiments, the recess in the first substrate is formed by means of subtractive manufacturing.

According to some embodiments, the method further comprises a step of providing pre-preg or sintering paste to at least a part of the recess, whereby the heat pipe tube is secured in the recess, prior to laminating the first substrate and the second substrate.

The disclosure also provides a printed circuit board comprising:

- a first substrate with a recess;
- a second substrate;
- a heat pipe tube with an open end, wherein the heat pipe tube is laminated embedded in the recess between the first substrate and the second substrate, such that a part of said heat pipe tube with the open end is exposed.

According to some embodiments, a part of the heat pipe tube with the open end extends a distance from a face of the first substrate.

According to some embodiments, the distance is at least 2 mm from the face of the first substrate.

According to some embodiments, the face of the first substrate is a lateral face.

The disclosure also provides a method of producing a circuit board, comprising:

- providing a printed circuit board according to embodiments disclosed herein;
- placing at least one electronic component on the printed circuit board;
- reflowing the printed circuit board such that the placed at least one electronic component is electrically connected to the printed circuit board.

According to some embodiments, the method of producing a circuit board further comprises the steps of:

- filling the heat pipe tube with a cooling media through the open end, after reflowing the printed circuit board; and
- sealing the open end of the heat pipe tube, after filling the heat pipe tube.

According to some embodiments, the method of producing a circuit board further comprises a step of

- providing the heat pipe tube with a pressure below the atmospheric pressure, prior to sealing the heat pipe tube.

According to some embodiments, the steps of filling and sealing the heat pipe tube are performed on the open end of the heat pipe tube that is exposed.

The disclosure also relates to a circuit board comprising:

- a printed circuit board according to embodiments;
- at least one component electrically connected to the printed circuit board and wherein the at least one component is thermally connected to the heat pipe tube; and wherein the heat pipe tube of the printed circuit board is filled with a cooling medium and is sealed.

According to some embodiments, the at least one component is thermally connected to the heat pipe tube by means of at least one thermal via.

According to some embodiments, a further component is arranged on the printed circuit board on a face opposing the face of the printed circuit board on which the at least one component is arranged, wherein the further component is thermally connected to the heat pipe tube by means of further at least one thermal via.

According to some embodiments, the further component is electrically connected to one of the at least one component by means of a signal via through the printed circuit board.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The description of the example embodiments provided herein have been presented for purposes of illustration. The description is not intended to be exhaustive or to limit example embodiments to the precise form disclosed, and modifications and variations are possible in light of the above teachings or may be acquired from practice of various alternatives to the provided embodiments. The examples discussed herein were chosen and described in order to explain the principles and the nature of various example embodiments and its practical application to enable one skilled in the art to utilize the example embodiments in various manners and with various modifications as are suited to the particular use contemplated. The features of the embodiments described herein may be combined in all possible combinations of methods, apparatus, modules, systems, and computer program products.

It should be appreciated that the example embodiments presented herein may be practiced in any combination with each other. It should be noted that the word "comprising" does not necessarily exclude the presence of other elements or steps than those listed and the words "a" or "an" preceding an element do not exclude the presence of a plurality of such elements. It should further be noted that any reference signs do not limit the scope of the claims, that the example embodiments may be implemented at least in part by means of both hardware and software, and that several "means", "units" or "devices" may be represented by the same item of hardware.

In the drawings and specification, there have been disclosed exemplary embodiments. However, many variations and modifications can be made to these embodiments. Accordingly, although specific terms are employed, they are used in a generic and descriptive sense only and not for purposes of limitation, the scope of the embodiments being defined by the following claims.

The invention claimed is:

1. A method of producing a printed circuit board, wherein the printed circuit board comprises:
- a first substrate;
- a second substrate;
- a heat pipe tube with an open end; and wherein
  - the method comprises the steps of:
  - forming a recess in the first substrate;
  - placing the heat pipe tube in the recess of the first substrate such that the open end is exposed; and
  - laminating the first substrate and the second substrate with the heat pipe tube embedded in the recess between the first substrate and the second substrate;
- wherein a part of the heat pipe tube with the open end extends a distance (d1) from a face of the first substrate.

2. The method according to claim 1, wherein said distance (d1) is at least 2 mm from the face of the first substrate.

3. The method according to claim 1, wherein the face of the first substrate is a lateral face.

4. The method according to claim 1, wherein the recess in the first substrate is formed by means of subtractive manufacturing.

5. The method according to claim 1, further comprising a step of providing pre-preg or sintering paste to at least a part of the recess, whereby the heat pipe tube is secured in the recess, prior to laminating the first substrate and the second substrate.

6. A printed circuit board comprising:
- a first substrate with a recess;
- a second substrate;
- a heat pipe tube with an open end, wherein the heat pipe tube is laminated and embedded in the recess between the first substrate and the second substrate, such that a part of said heat pipe tube with the open end is exposed;
- wherein a part of the heat pipe tube with the open end extends a distance (d1) from a face of the first substrate.

7. The printed circuit board according to claim 6 wherein said distance (d1) is at least 2 mm from the face of the first substrate.

8. The printed circuit board according to claim 6, wherein the face of the first substrate is a lateral face.

9. A method of producing a circuit board, comprising:
- providing a printed circuit board according to claim 6;
- placing at least one electronic component on the printed circuit board;
- reflowing the printed circuit board such that the placed at least one electronic component is electrically connected to the printed circuit board.

10. The method according to claim 9, further comprising the steps of:
- filling the heat pipe tube with a cooling media through the open end, after reflowing the printed circuit board; and
- sealing the open end of the heat pipe tube, after filling the heat pipe tube.

11. The method according to claim 10, further comprising a step of
- providing the heat pipe tube with a pressure below the atmospheric pressure, prior to sealing the heat pipe tube.

12. The method according to claim 10, wherein the steps of filling and sealing the heat pipe tube is performed on the open end of the heat pipe tube that is exposed.

13. A circuit board comprising:
- a printed circuit board according to claim 6;
- at least one component electrically connected to the printed circuit board and wherein the at least one component is thermally connected to the heat pipe tube; and
- wherein the heat pipe tube of the printed circuit board is filled with a cooling medium and is sealed.

14. The circuit board according to claim 13, wherein the at least one component is thermally connected to the heat pipe tube by means of at least one thermal via.

15. The circuit board according to claim 13, wherein a further component is arranged on the printed circuit board on a face opposing the face of the printed circuit board on which the at least one component is arranged, wherein the further component is thermally connected to the heat pipe tube by means of further at least one thermal via.

16. The circuit board according to claim 15, wherein the further component is electrically connected to one of the at least one component by means of a signal via through the printed circuit board.

17. A method of producing a printed circuit board that comprises a first substrate, a second substrate, and a heat pipe tube with an open end, the method comprising the steps of:

forming a recess in the first substrate wherein the recess in the first substrate is formed by means of subtractive manufacturing;

placing the heat pipe tube in the recess of the first substrate such that the open end is exposed; and laminating the first substrate and the second substrate with the heat pipe tube embedded in the recess between the first substrate and the second substrate.

* * * * *